US010203851B2

(12) United States Patent
Minekawa et al.

(10) Patent No.: US 10,203,851 B2
(45) Date of Patent: Feb. 12, 2019

(54) DEFECT CLASSIFICATION APPARATUS AND DEFECT CLASSIFICATION METHOD

(71) Applicant: Hitachi High-Technologies Corporation, Minato-ku, Tokyo (JP)

(72) Inventors: Yohei Minekawa, Tokyo (JP); Yuji Takagi, Tokyo (JP); Minoru Harada, Tokyo (JP); Takehiro Hirai, Tokyo (JP); Ryo Nakagaki, Tokyo (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 1058 days.

(21) Appl. No.: 14/360,636

(22) PCT Filed: Nov. 26, 2012

(86) PCT No.: PCT/JP2012/080416
§ 371 (c)(1),
(2) Date: May 26, 2014

(87) PCT Pub. No.: WO2013/099487
PCT Pub. Date: Jul. 4, 2013

(65) Prior Publication Data
US 2014/0331173 A1 Nov. 6, 2014

(30) Foreign Application Priority Data
Dec. 28, 2011 (JP) ................. 2011-287369

(51) Int. Cl.
*G06T 7/00* (2017.01)
*G02B 21/36* (2006.01)
(Continued)

(52) U.S. Cl.
CPC ....... *G06F 3/04842* (2013.01); *G02B 21/365* (2013.01); *G06F 9/451* (2018.02);
(Continued)

(58) Field of Classification Search
CPC .......... G06F 17/30707; G06F 17/3016; G06F 17/3071; G06F 3/04842; G06F 3/0482;
(Continued)

(56) References Cited

U.S. PATENT DOCUMENTS 6,999,614 B1   2/2006   Bakker et al.
8,473,532 B1 * 6/2013   Ben .................. G06F 17/30091
                                                        707/694
(Continued)

FOREIGN PATENT DOCUMENTS

CN   1011120329 A   2/2008
JP   08-021803 A    1/1996
(Continued)

*Primary Examiner* — William L Bashore
*Assistant Examiner* — Daniel W Parcher
(74) *Attorney, Agent, or Firm* — Miles & Stockbridge P.C.

(57) ABSTRACT

Provided is a GUI including: an unadded pane region that hierarchically displays folders which are sets of images having no class information added thereto; an image pane region that displays the images displayed in the unadded pane region, the displayed images having no classification added thereto; and a class pane region that displays images having classification added thereto, wherein by externally inputting class information for one image having the class information added thereto, the input class information is displayed.

21 Claims, 10 Drawing Sheets

(51) Int. Cl.
*G06F 17/30* (2006.01)
*G06F 9/451* (2018.01)
*G06F 3/0484* (2013.01)
*H01J 37/26* (2006.01)

(52) U.S. Cl.
CPC .......... *G06T 7/0004* (2013.01); *H01J 37/265* (2013.01); *G06F 17/3071* (2013.01); *G06F 17/30707* (2013.01); *H01J 2237/2817* (2013.01)

(58) Field of Classification Search
CPC .................. G06F 9/451; G02B 21/365; H01J 2237/2817; G06T 7/0004
See application file for complete search history.

(56) References Cited

U.S. PATENT DOCUMENTS

| | | | | |
|---|---|---|---|---|
| 2002/0001404 | A1* | 1/2002 | Yoshikawa | G06T 7/0002 382/145 |
| 2004/0028276 | A1 | 2/2004 | Okuda et al. | |
| 2005/0166156 | A1* | 7/2005 | Frigon | G06F 17/3028 715/764 |
| 2006/0082763 | A1 | 4/2006 | Teh et al. | |
| 2006/0139461 | A1* | 6/2006 | Matsui | G11B 27/105 348/231.2 |
| 2006/0184892 | A1* | 8/2006 | Morris | G06F 17/30014 715/767 |
| 2006/0274932 | A1 | 12/2006 | Ikeda et al. | |
| 2008/0187212 | A1 | 8/2008 | Obara et al. | |
| 2009/0030629 | A1 | 1/2009 | Lampe | |
| 2009/0207254 | A1* | 8/2009 | Tomat | G06F 3/0481 348/207.1 |
| 2010/0257127 | A1* | 10/2010 | Owens | G06N 7/005 706/12 |
| 2010/0281390 | A1* | 11/2010 | Kurtz | G06F 17/30126 715/738 |
| 2011/0040980 | A1* | 2/2011 | Kerr | G06F 21/6245 713/189 |
| 2014/0037188 | A1 | 2/2014 | Nakagaki et al. | |

FOREIGN PATENT DOCUMENTS

| | | |
|---|---|---|
| JP | 2001-156135 A | 6/2001 |
| JP | 2004-077165 A | 3/2004 |
| JP | 2006-189462 A | 7/2006 |
| JP | 2008-516259 A | 5/2008 |
| JP | 2009-123851 A | 6/2009 |
| JP | 2010-39620 | 2/2010 |

\* cited by examiner

DEFECT CLASSIFICATION APPARATUS AND DEFECT CLASSIFICATION METHOD

TECHNICAL FIELD

The present invention relates to a GUI for an image captured by imaging a surface of a semiconductor wafer, a classification apparatus, a classification method, and a storage medium storing a program.

BACKGROUND ART

In a semiconductor manufacturing process, in order to increase a yield rate, it is important to quickly determine a cause of occurrence of a defect on a semiconductor wafer. In existing circumstance, in a semiconductor manufacturing site, a defect is analyzed by using a defect checking apparatus and a defect observing apparatus.

The defect checking apparatus is an apparatus that observes a wafer by using an optical means or an electron beam and that outputs position coordinates of a detected defect. Since it is important for the defect checking apparatus to perform high speed processing on a broad range, reduction in image data amount by increasing pixel sizes (that is, conversion to low resolution) of an image to be acquired as much as possible is performed. In many cases, if the existence of the defect can be recognized from a detected low resolution image, it is difficult to identify the type (defect type) of the defect in detail.

Accordingly, a defect observing apparatus is used. The defect observing apparatus is an apparatus that uses output information of the defect checking apparatus to perform imaging on coordinates of a defect on a wafer at a high resolution, and that outputs an image. In the semiconductor manufacturing process, micronizing is proceeded with, and also defect size accordingly reaches an order of several tens of nm. In order to observe the defect in detail, a resolution in an order of several nm is necessary. Accordingly, in recent years, a defect observing apparatus (review SEM) using a scanning electron microscope (SEM) is widely used. The review SEM has an ADR (Automatic Defect Review) function of automatically collecting high resolution images (defect images) of defects on a wafer by using defect coordinates output by the defect checking apparatus.

The captured SEM images are classified on the basis of the types of imaged defects, and the like. In a classification operation, a user recognizes the images, and adds, to each image, a class (user class) to be added by the user. The above class adding operation is often manually done by the user, and is called manual classification. Manual classification of defect images is called manual defect classification (MDC). Note that in classification of SEM images, for the purpose of specifying a circuit pattern in which a defect easily occurs, the images may be classified on the basis of circuit patterns in on-image defect portions and around the defect portions.

Since in recent years, a throughput of the ADR of the review SEM increases, also a function that automates an operation of identifying defect types from a large quantity of collected defect images has been proposed. The review SEM is provided with a classifying ADC (automatic defect classification) function for automatically identifying and classifying defect types from defect images.

As one method of automatic classification, a method that quantifies appearance feature amounts of defect regions by image processing to perform classification using a neural network is disclosed in PTL 1 (JP 8-21803 A). In the automatic classification, classification is performed in accordance with classification recipes. The classification recipes includes various types of parameters such as image processing parameters, information (classification classes) on defect types to be classified, and defect images (instruction images) belonging to the respective classification classes. The instruction images are necessary for giving classification criteria of the respective classes to the automatic classification, and are basically given by the MDC. Classification results by the MDC greatly influence the performance of the ADC. Thus, the manual classification remains placed at an important position.

In addition, in the image classification, as a classification technique using image feature amounts obtained by image processing, a technique that performs unsupervised classification on images and simultaneously add classes to classification results is disclosed in PTL 2 (JP 2008-516259 W) and PTL 3 (U.S. Pat. No. 6,999,614).

CITATION LIST

Patent Literatures

PTL 1: JP 8-21803 A
PTL 2: JP 2008-516259 W
PTL 3: U.S. Pat. No. 6,999,614

SUMMARY OF INVENTION

Technical Problem

The manual classification described in the Background Art is an operation in which a user visually recognizes appearance features of defect regions in captured SEM images and circuit patterns in defect regions or around the defect regions and classifies them into multiple defect classes defined beforehand. This operation requires the user to select, from among a large number of images in which images of multiple different classes coexist, images of each class, and to add the class to the images, so that this operation has a problem in that it has a large load on the user and takes a time.

In addition, according to the technology disclosed in PTL 1, as described above, the manual classification remains placed at an important position. According to the technologies disclosed in PTLs 2 and 3, insufficiency in resolution or the like does not always produce correct results. Accordingly, an operation (correcting operation) that requires recognition of results by the user and manual separation of images in classification results in each class. However, this operation has a problem in that it has a large load on the user.

Accordingly, it is an object to provide a GUI having a less load on a user, a classification apparatus, a classification method, a program, and a storage medium storing the program.

The above object and other objects, and new features of the present invention will become apparent from the description of this specification and the accompanying drawings.

Solution to Problem

Among the inventions disclosed in the present application, representative outlines of the inventions will be briefly described in the following.
(1) A GUI including: an unadded pane region that hierarchically displays folders which are sets of images having no class information added thereto; an image pane region that displays the images displayed in the unadded pane region, the displayed images having no classification added thereto; and a class pane region that displays images having classification added thereto, wherein by externally inputting class information for one image having no class information added thereto, the input class information is displayed.

(2) A classification apparatus including the GUI according to any of claims 1 to 15, including: an image capturing unit that emits an electron beam to a surface of an object to be checked, detects electrons generated from the surface of the object, and converts the detected electrons into an image; and a processor including an image feature calculating unit that calculates a feature amount of the image by processing the image in the image capturing unit, a hierarchical structure generating unit that generates a hierarchical structure of folders including the image by using the feature amount of the image calculated by the image feature calculating unit, and a class information adding unit that, in a case where class information is externally input for the folders having the hierarchical structure generated by the hierarchical structure generating unit, adds class information to images in the folders.

Advantageous Effects of Invention

According to the present invention, a GUI having a less load on a user, a classification apparatus, a classification method, a program, and a storage medium storing the program can be provided.

DESCRIPTION OF EMBODIMENTS

First Embodiment

Embodiments of the present invention will be described in detail on the basis of the drawings. Note that in all the drawings for describing the embodiments, identical members are denoted by identical reference signs, whereby their repeated descriptions are omitted. Although this embodiment describes as a target a case where defect images captured by an image capturing apparatus provided with an SEM are classified, those other than SEM images may be input to a defect classification system according to the present invention, and defect images captured by using optical means, an ion microscope, and the like, may be input.

Figure 1:
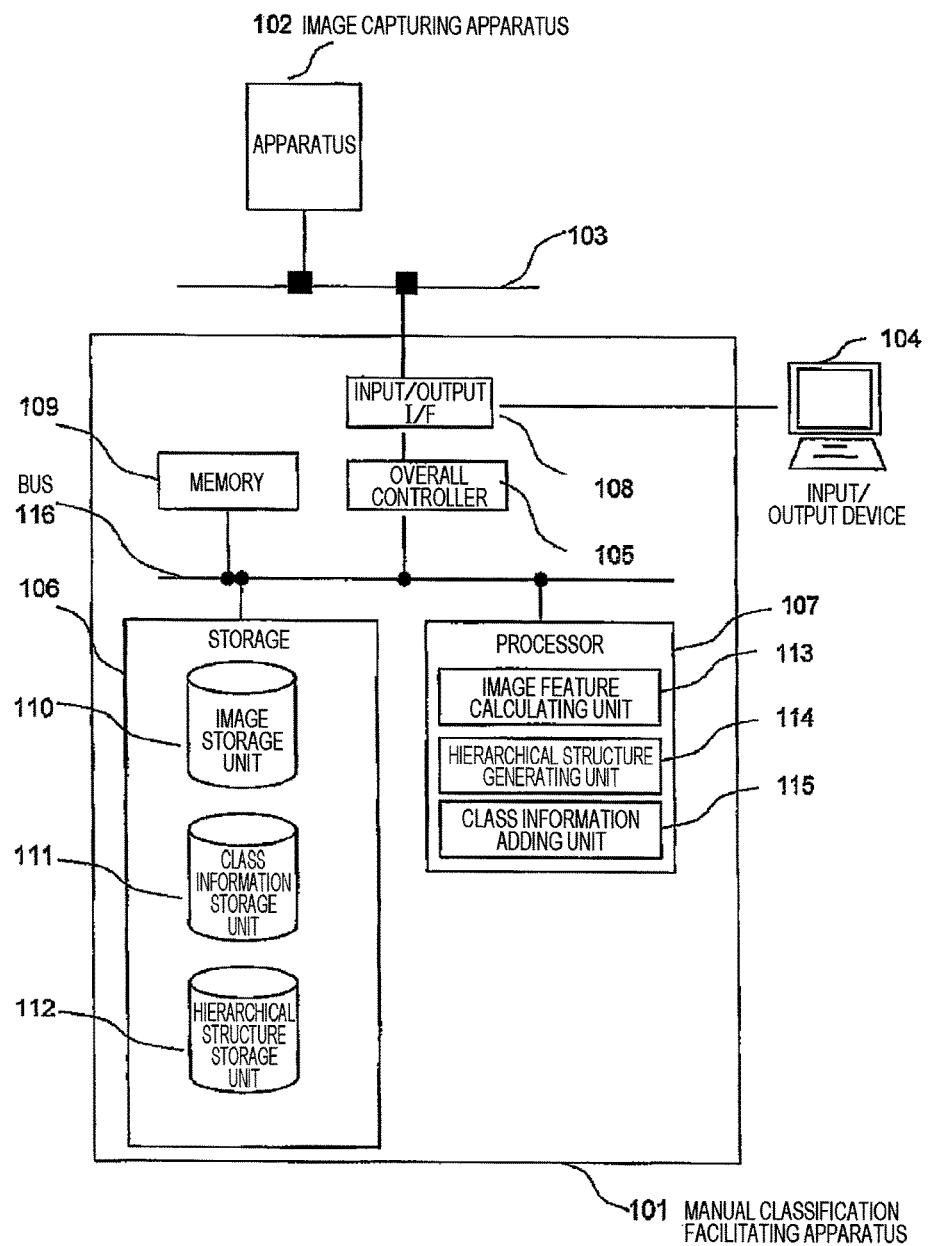
FIG. 1 is a configuration diagram illustrating a classification apparatus according to first embodiment of the present invention.

FIG. 1 is a configuration diagram illustrating the configuration of a classification apparatus according to first embodiment of the present invention. This classification apparatus has a configuration with an image capturing apparatus 102 connected to it via a communication means 103.

The image capturing apparatus 102 is an apparatus that acquires images of a targeted region. Details of the image capturing apparatus 102 will be described later using FIG. 2. The classification apparatus 101 has a function of outputting, to an input/output device 104, information for adding class information to the images obtained by the image capturing apparatus 102, and adding class information to the images on the basis of information input to 104 by a user. The input/output device 104 includes a keyboard, a mouse, and a display device for displaying data to an operator and receiving inputs from an operator.

Details of the classification apparatus 101 will be described below.

The classification apparatus 101 includes: an overall controller 105 that control operations of the apparatus; a storage 106 that stores images input from the image capturing apparatus 102, class information added, and the like; a processor 107 that creates information to be displayed to a user, and that adds class information to each image on the basis of a user's input; an input/output I/F 108 for data transfer via the input/output device 104 and the communication means 103; a memory 109 that stores a program, and the like; and a bus 116 that performs data communication among the storage 106, the processor 107, the memory 109, the overall controller 105, and the input/output I/F 108.

The storage 106 includes an image storage unit 110 that stores images from the image capturing apparatus 101, a class information storage unit 111 that stores class information added to each image stored in the image storage unit 110 by the apparatus 101, and a hierarchical structure storage unit 112 that stores information, having a hierarchical structure, to be displayed on the input/output device 104. In addition, the processor 107 includes an image feature calculating unit 113 that calculates as a quantitative value (feature amount) a feature of the image stored in the image storage unit 110, a hierarchical structure generating unit 114 that generates information, having a hierarchical structure, to be stored in the hierarchical structure storage unit 112 from the feature amount calculated by the image feature calculating unit 113, and a class information adding unit 115 that adds class information to the image on the basis of the user's input to the input/output device 104. Note that details of the hierarchical structure will be described later using FIGS. 3 and 4. Processing steps and method of the processor 107 will be described later.

A recording medium (not illustrated) is connectable to the input/output device 104 of the classification apparatus 101. The classification apparatus 101 is configured such that a program to be executed by it can be read from this recording medium and loaded into the classification apparatus 101.

The image data output from the image capturing apparatus 102 is sent to the image storage unit 110 via the input/output I/F 108 and the overall controller 105, and is stored in the image storage unit 110 so as to be readable. A manual classification facilitating program is read from the memory 109 or the recording medium by the overall controller 105. In accordance with the program, by controlling the processor 107, the overall controller 105 displays information, such as the images, stored in the storage 106 and intermediate data stored in the memory 109 on the input/output device 104 in a GUI illustrated in FIG. 8 via the input/output I/F 108, and receives an input from the user with the input/output device 104. The user's input to the input/output device 104 is sent to the overall controller 105 via the input/output I/F 108. In accordance with the program, by processing information such as images stored in the storage 106 with the processor 107, and intermediate data stored in the memory, the overall controller 105 adds class information to the image. Transmission and reception of the data in the classification apparatus 101 is performed via a bus 116.

Figure 2:
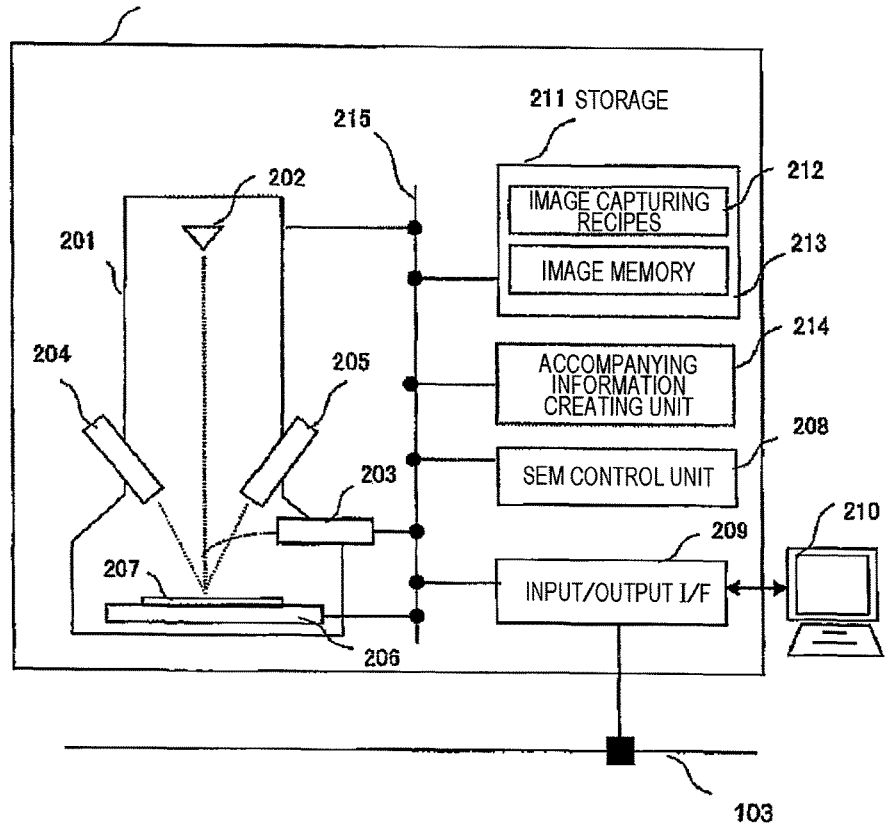
FIG. 2 is a configuration diagram illustrating an image capturing apparatus according to first embodiment of the present invention.

FIG. 2 is a configuration diagram illustrating the configuration of the image capturing apparatus of the classification apparatus according to first embodiment of the present invention. The image capturing apparatus 101 is configured such that an SEM column 201, an SEM control unit 208, an input/output I/F 209, a storage 211, and an accompanying information creating unit 214 are connected via a communication means 215. An input/output unit 210 is connected to the input/output I/F 209, whereby input and output of data with respect to the operator is performed.

The SEM column 201 includes an electron source 202, a sample wafer 207 and a stage 206 on which it is placed, and multiple detectors 203, 204, and 205 that detect secondary electrons and backscattered electrons which are generated as the result of emitting a primary electron beam from the electron source 202 to the sample wafer 207. Note that furthermore, the SEM column 201 also includes a deflector (not illustrated) for causing the primary electron beam to scan an observation area of the sample wafer 207, and an image generator (not illustrated) that generates a digital image by performing digital conversion on the intensity of the detected electrons. Note that an image obtained by detecting the secondary electrons with the detector 203 is called an SE image, and images obtained by detecting backscattered electrons with the detectors 204 and 205 are called an L image and an R image, respectively.

The storage 211 includes an image capturing recipes storing unit 212 that stores an acceleration voltage, a probe current, a frame addition number (the number of images for use in a process that reduces an effect of shot noise by acquiring multiple images of the same place and creating an average image of them), a viewing field size, and the like, which are SEM image capturing conditions, and an image memory 213 that stores acquired image data.

The accompanying information creating unit 214 has a function of creating information accompanying individual image data, for example, image capturing conditions such as an acceleration voltage at the time of image capturing, a probe current, and a frame addition number, ID information identifying an image capturing apparatus, types and properties of the detectors 203 to 205, which are used in creating images, an ID and step of a wafer, and information such as a date and time at which each image was captured. The information on the ID and step of the wafer may be input from the input/output unit 210 or the like by the user, may be read from the surface or the like of the wafer, and may be read out from a box (not illustrated) accommodating the wafer, or the like. When image data is transferred via the input/output I/F 209, the created accompanying information is transferred together with the image data.

The SEM control unit 208 is a region that controls all processes which are performed by the image capturing apparatus 102. Under instructions of the SEM control unit 208, movement of the stage 206 in order to enter a predetermined observation region on the sample wafer 207 into an image capturing viewing field, emission of a primary electron beam onto the sample wafer 207, detection by the detectors 203 to 205 of electrons generated from the sample, imaging and storing of the detected electrons in the image memory 213, creation of accompanying information for captured images by the accompanying information creating unit 214, and the like, are performed. Various instructions, designation of image capturing conditions, and the like, from the operator, are given through the input/output unit 210, which includes a keyboard, a mouse, and a display.

The hierarchical structure to be displayed to the user on the input/output device 104 will be described below using FIGS. 3 and 4.

Figure 3:
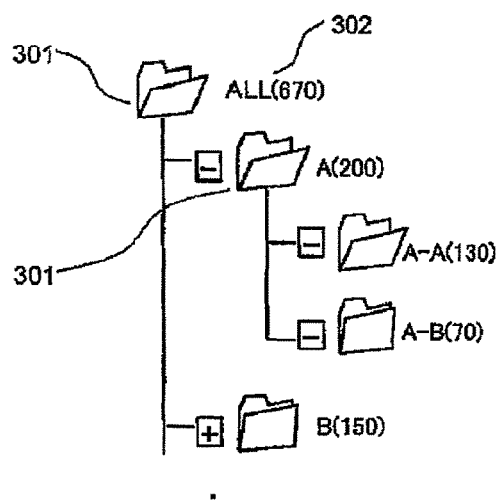
FIG. 3 is an explanatory chart for explaining a hierarchical structure of a classification apparatus according to first embodiment of the present invention.

FIG. 3 is an explanatory chart of the classification apparatus according to first embodiment.

FIG. 3 represents a display example of the hierarchical structure displayed in the GUI. 301 denotes sets (hereinafter referred to as folders) of images, and these folders are hierarchically disposed (connected). Note that an uppermost folder is called a root folder. 302 denotes information (hereinafter referred to as a label) such as a folder name and the number of images included in a folder. Images included in each folder are images whose features are similar (that is, whose feature amounts are similar values). The example in FIG. 3 has a structure in which a folder having label A and a folder having label B are connected to below a folder having label ALL as a root folder, and in which folders having label A-A and label A-B are connected below label A. Here, it is assumed that the folders having label A-A and label A-B are in the same layer. Note that also the folders having label A and label B are similarly folders in the same layer. Although in FIG. 3, hierarchical depths of lower folders in folder A are identical, the hierarchical depths may differ in the same folder.

Figure 4:
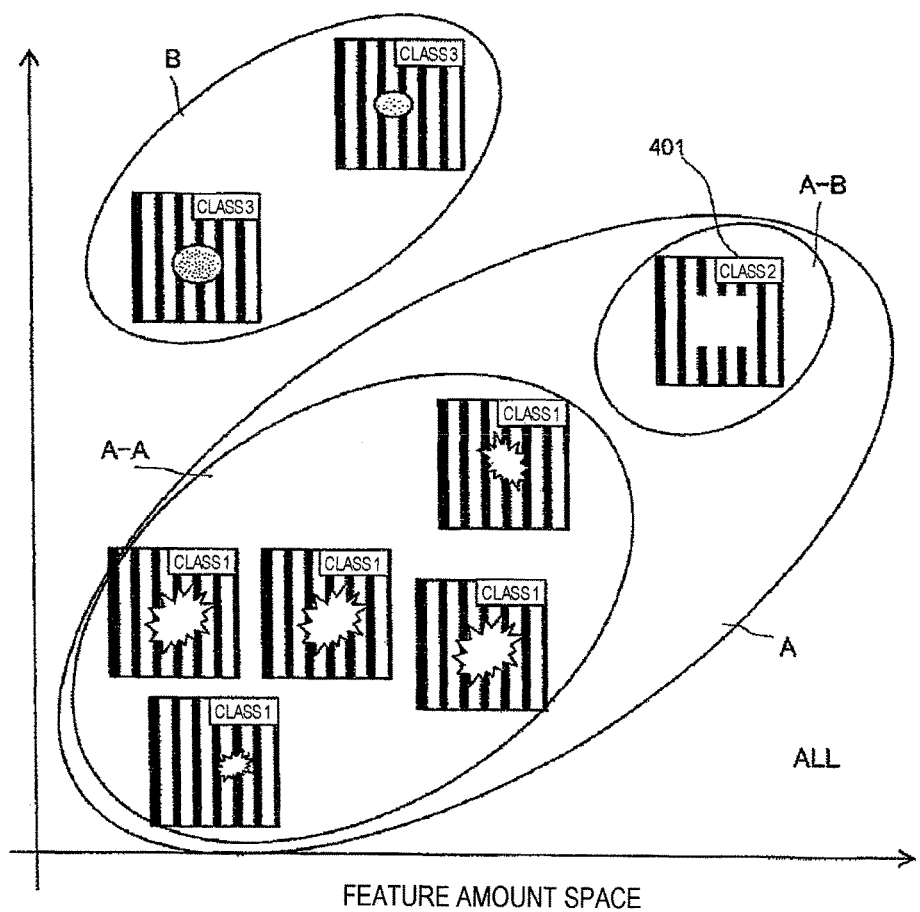
FIG. 4 is an explanatory chart of distributions of feature amounts in images of individual classes on a feature space.

FIG. 4 is an explanatory chart of distributions of feature amounts in images of individual classes on a feature amount space of images included in the folders illustrated in FIG. 3. Although this represents the feature amount space in two dimensions for description, the feature amount space is not limited to the two-dimensional feature amount space. As illustrated in FIG. 4, it is assumed that an upper folder includes a feature amount space of a lower folder. For example, the folder having label A includes feature amount spaces of lower folders having label A-A and label A-B. In other words, the upper folder includes images of the lower folders.

One example of a distribution on a feature space of images 401 includes in the folder having labels A and B in FIG. 4. Note that, for description, class names (classes 1 to 3) are indicated in upper right portions of the images 401. In the folder having label A, images of class 1 and class 2 coexist. However, the lower folders having labels A-A and A-B include only images of single classes as class 1 and class 2, respectively. The folder having label B includes only images of a single class as class 3. In addition, a local feature amount such as speeded up robust features (SURF) used in a generic object recognition may be used.

As described above, the hierarchical structure is such that, as the hierarchy is deeper, the ratio of images of a particular class to one or more images included in the folder in the folder 301. Here, the ratio of the images of the particular class represents the ratio of classes assigned to the particular class by unsupervised classification.

Note that the feature amount calculated by the image feature calculating unit 113 may be changed in accordance with a determination criterion (purpose of classification) for a class for which classification is desired to be performed. For example, in the case of desiring to add an in-image defect type as a class, a feature to be used as criteria for the human to determine a defect, such as a luminance in a defect region, defect size, degree of circularity, or a degree of irregularity, may be calculated as a quantitative value. In addition, in the case of desiring to add a class on the basis of an in-image circuit pattern, a value obtained by quantizing the density, shape, three-dimensional structure, or the like, of the circuit may be used. In the case of adding a class on the basis of a circuit pattern, design data may be used as information such as the density, shape, and three-dimensional structure of the circuit pattern may be used.

In addition, when the user determines a purpose of classification (determination criterion for the class for which classification is to be performed) using the GUI, it may automatically be determined which feature is to be used on the basis of a predetermined condition. Also, a feature to be used, itself, may be selected by the user.

In the case of purposing MDC at the time of creating classification recipes of ADC, there can be also a method of using a feature amount that is used in a classification process of ADC.

In addition, a feature amount different from ADC may be used. In general, in many cases, since highly accurate automatic classification is performed, a feature amount in ADC is based on a precondition that severe adjustment of a feature amount calculating parameter is performed before feature amount calculation. By using the above-described local feature amount or the like, the need to severely adjust a feature amount beforehand is eliminated.

In addition, the above-described feature amounts may be used in combination. The feature amount to be used may be designated by methods such as causing the user to designate it on the GUI, and designating it in a text file or the like.

The above-described hierarchical structure is generated by the hierarchical structure generating unit 114 illustrated in FIG. 1, using images captured by the image capturing apparatus 102, and information on the hierarchical structure is stored in the hierarchical structure storage unit 112. The information on the hierarchical structure means information necessary for displaying the hierarchical structure, such as information on images included in folders, and a connection relationship (information such as upper layers, lower layers, and identical layers) of folders.

A process of the hierarchical structure generating unit 114 will be described below. Regarding the hierarchical structure, there can be a method of creating the hierarchical structure from a lowermost layer by using a technique such as hierarchical clustering as a type of unsupervised classification technique.

Figure 5:
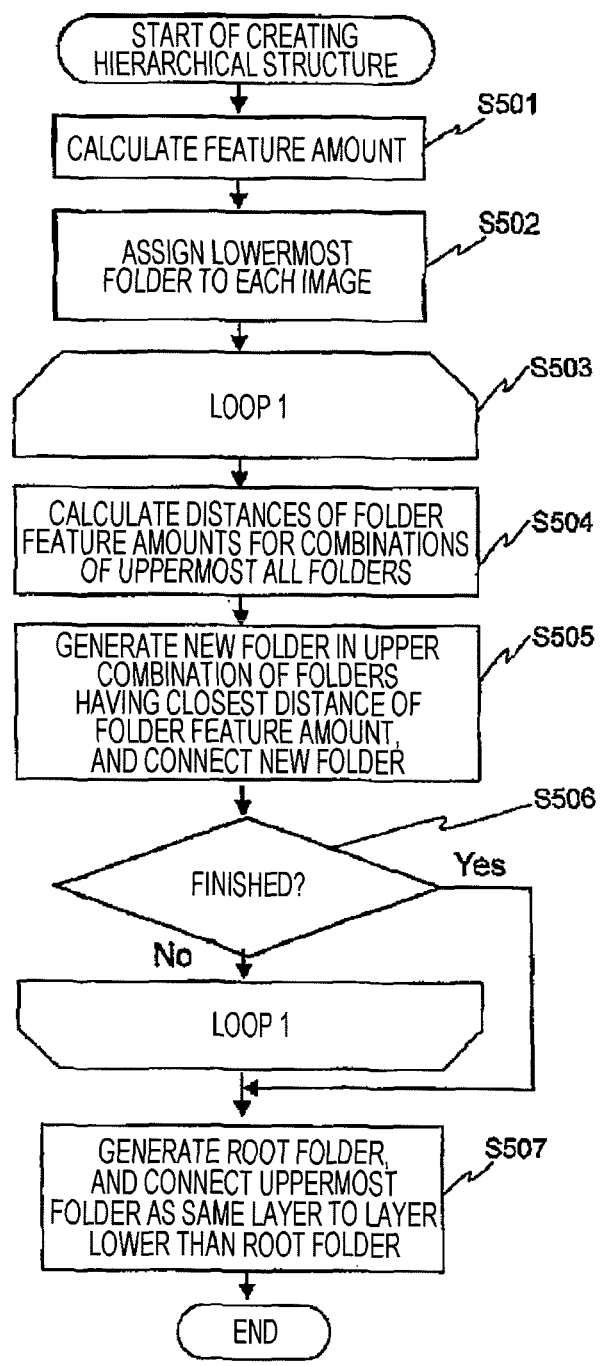
FIG. 5 is a flowchart of the case of generating a hierarchical structure from lower layers in the classification method according to first embodiment of the present invention.

FIG. 5 is a flowchart in the case of creating the hierarchical structure from lower layers in the classification method according to first embodiment of the present invention.

In S501, the image feature calculating unit 113 calculates a feature amount for each image captured by the image capturing apparatus 102 in FIG. 1. Here, the calculation may be made by using a part of the image or by using whole part of the image.

In S502, lowermost folders are generated as many as the number of images, and the lowermost folders are assigned to the respective images. Note that although a method of assigning one lowermost folder to one image has been described, after putting together, as sets, multiple images, whose features are mutually close, by unsupervised classification (for example, k-means technique or the like), the multiple images in each set may be assigned to one corresponding lowermost folder. Here, in a case where the images have been put together beforehand as sets of multiple images by unsupervised classification, it is only required that the number of folders to be assigned to the respective images be less. Thus, it is only necessary for memory size to be less. In addition, it is only required that the amount of calculating distances of folder feature amounts in S504, which is described later, be less.

S503 is a loop of processing, and processing in S504 to S506 is repeatedly executed until a determination condition of S506 is satisfied.

In S504, regarding all combinations of the uppermost folders, distances of folder feature amounts are calculated. The distances may be calculated as Euclidean distances of feature amounts. Note that although the combinations of the folders are described below as a combination of two folders, similar processing can be performed for a combination of three or more folders. Here, an uppermost folder is an uppermost folder among the folders connected in S505 (that is, folders connected to a lower layer are regarded as not subjected to distance calculation). Note that unconnected folders for which the processing in S505 has not been performed are treated as uppermost folders and are subjected to distance calculation. In addition, the folder feature amount is a folder representing feature amount calculated from feature amounts of images in a folder. For example, the average value of feature amounts of images in a folder, and a feature amount of an image which is the closest to the average value of feature amounts may be used as a folder feature amount. The fact that distances of folder feature amounts are close means that images in the folders are similar.

In S505, a new folder is created in a layer above a combination of folders in which folder feature amounts have the closest distance, and the folders are connected to the new folder. At this time, two folders in the combination of folders having the closest distance are regarded as being in the same layer, and are connected to below the generated new folder. Here, although two folders having the closest distance is regarded as being in the same layer, the number of new folders to be generated is not limited to one. With multiple sets of predetermined folder sets regarded as being in the same layer, new folders may be generated. For example, in a case where the number of folders to be generated is three, new folders are generated for three folder sets from a folder set having folder feature amounts having the closest distance. The number of new folders to be generated may set by the user. Also, after setting beforehand a threshold value of the distance of the folder feature amount, for all folder sets each having a distance shorter than the threshold value, new folders may be generated.

S506 is a process of determining termination of generating the hierarchical structure. In a case where the termination is determined, loop 1 in S503 is escaped. As a method of determining the termination, the termination may be determined on the basis of such as whether the number of uppermost folders is equal to or less than a predetermined number. Note that the predetermined number may be set beforehand by the user.

In S507, the root folder is generated, and below the root folder, the uppermost folders are mutually connected as folders in the same layer.

In addition, from a distribution of the feature amounts, S505 may perform determination of whether to generate a further upper folder. For example, the determination may be performed by such as a method of comparing evaluation values before and after generating the upper folder; and generating the upper folder in a case where the value improves, while not generating the upper folder in a case where the value does not improve. The average value of dispersions of feature amounts included in a folder, a Bayesian information criterion, or the like may be used as the evaluation value. In addition, in a case where an increment of the evaluation value is equal to or greater than a predetermined threshold value, the upper folder may be generated. Here, in a case where it is determined that the upper folder is not be generated, the upper folder is not generated, and two folders in a combination of folders whose folder feature amounts are the closest are directly connected to the root folder. In that case, these folders are not subjected to the distance calculation in S504. In addition, in the termination determination in S506, the termination may be performed in a case where the number of folders subjected to the distance calculation in S504 is one, or is equal to or less than a predetermined number. In addition, with the GUI or the like, by confirming by the user the number of folders generated, and the number of images in each folder, it may be determined whether to generate a further upper folder.

Note that the above description has stated as an example the method of: in S501, calculating a feature amount for each image; in S504, calculating a feature amount in each folder and calculating a distance of the folder feature amount. However, the calculation of the feature amount in each image and the calculation of the folder feature amount are not essential, and this flow is executable if the distance of the folder feature amount is obtained in S504. For example, the image feature calculating unit 113 may calculate a normalized cross-correlation (NCC) for a representative image in two folders which is subjected to calculation of the distance of the folder feature amount, and may calculate a distance from the distance. In this case, as the absolute value of the NCC is greater, the distance may be regarded as closer. In addition, a feature amount of a representative image in each image may be used as a folder feature amount without calculating a feature amount for each image and calculating a folder feature amount.

Figure 6:
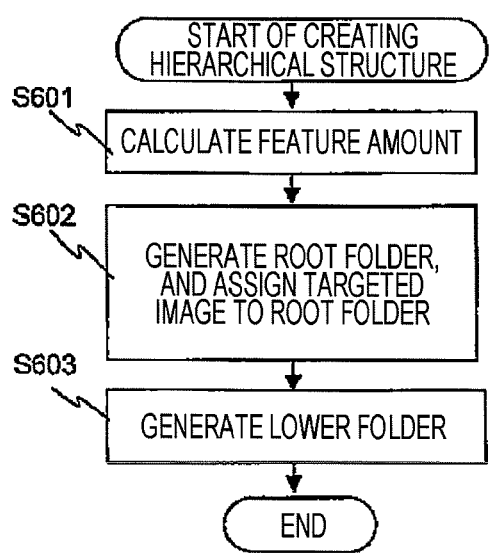
FIG. 6 is a flowchart of the case of generating a hierarchical structure from upper layers in the classification method according to first embodiment of the present invention.
Figure 12:
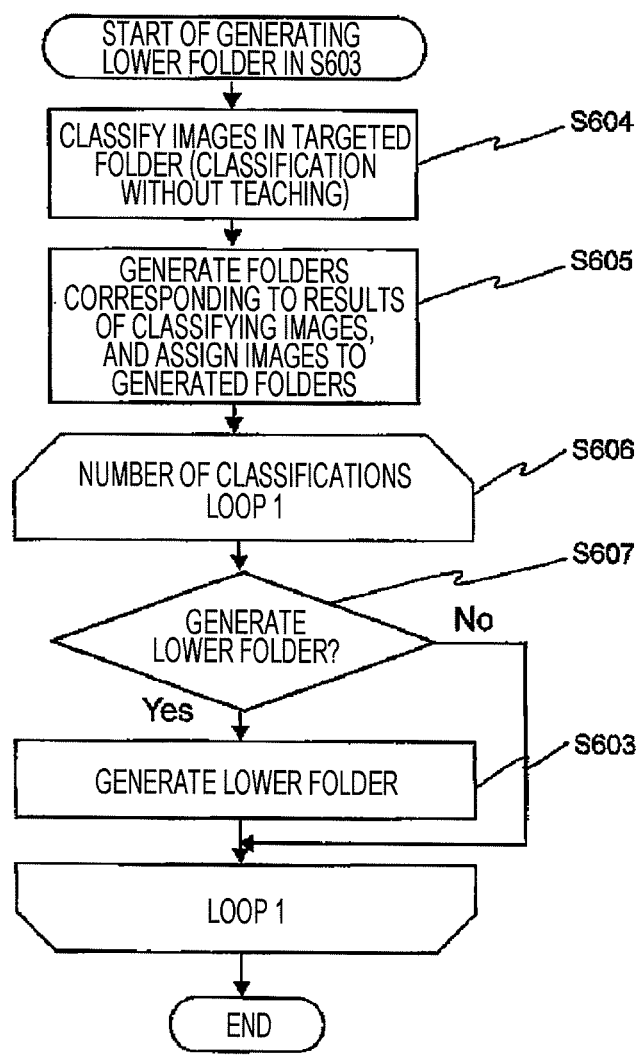
FIG. 12 is a flowchart in a restart processing unit in the case of creating a hierarchical structure from upper layers in the classification method according to first embodiment of the present invention.

In addition, there can be a method of sequentially generating the hierarchical structure from a root folder by using a technique such as k-means as a type of an unsupervised classification technique. FIGS. 6 and 12 illustrate examples of flowcharts in the case of creating the hierarchical structure from upper layers. FIG. 6 is a flowchart in the case of creating the hierarchical structure from upper layers in the classification according to first embodiment, and FIG. 12 is a flowchart of a restart processing unit in the case of creating the hierarchical structure from upper layers according to first embodiment.

In S601, similarly to S501, the image feature calculating unit 113 calculates a feature amount for each image.

In S602, a root folder is generated, and a targeted image is assigned to the root folder.

S603 is a restart process that creates a lower folder, and its details are illustrated in FIG. 12. Processing in S604 to S607 in FIG. 12 will be described below.

In S604, unsupervised classification on images in a folder (upper folder) subjected to lower folder generating is performed. The classification may be performed by a technique such as the k-means. The k-means makes it necessary to designate the number of classifications beforehand. The number of classifications may be designated such that it is set by the user beforehand, and may automatically be determined on the basis of a distribution of feature amounts, or the like. In addition, as a technique that does not require setting of the number of classifications, the x-means or the like may be used.

In S605, folders are generated as many as the number of classifications in S604, and the images are assigned to the folders corresponding to the classifications.

S606 is a loop that executes the processes of S607 and S603 by the number of classifications of S604, and executes processing on each folder corresponding to each classification. A folder corresponding to each classification, for which the processing is executed, is called a targeted folder.

S607 is processing that determines whether to generate a lower folder for the targeted folder. As a method of the determination, there can be a method in which a lower folder is not generated when the number of images included in the targeted folder is equal to or less than a predetermined number, or when a similarity level (distance between images) of images included in the targeted folder is equal to or less than a threshold value, and a method in which images included in the targeted folder are confirmed by the user with the GUI or the like, and it is determined whether to generate a lower folder. In a case where it is determined in S607 that a lower folder is to be generated, the processing in S603 (that is, the process in FIG. 12) is executed on the targeted folder. That is, the process is repeated until it is determined that further lower folders are to be generated for all the folders.

The above-described methods make possible to generate and display the hierarchical structure of folders to the user. In general, since a class criterion does not exist in unsupervised classification, there are many cases in which images of different classes coexist in classification results. The techniques described in PTLs 2 and 3 simultaneously add classes to classification results of unsupervised classification, thus requiring an operation (correcting operation) of separating images in the classification results for each class. Comparatively, in a case where images of different classes coexist in a folder, the hierarchical structure of the present invention makes it possible for the user to confirm images included in lower folders and to search for and designate a folder including only images of a single class. By collectively adding class information to a folder including images of a single folder, it is possible to perform accurate addition of class information. In addition, since the correcting operation is completed by the operation of searching for a folder including only images of a single folder, it is possible to easily realize the correcting operation in a short time.

Figure 8:
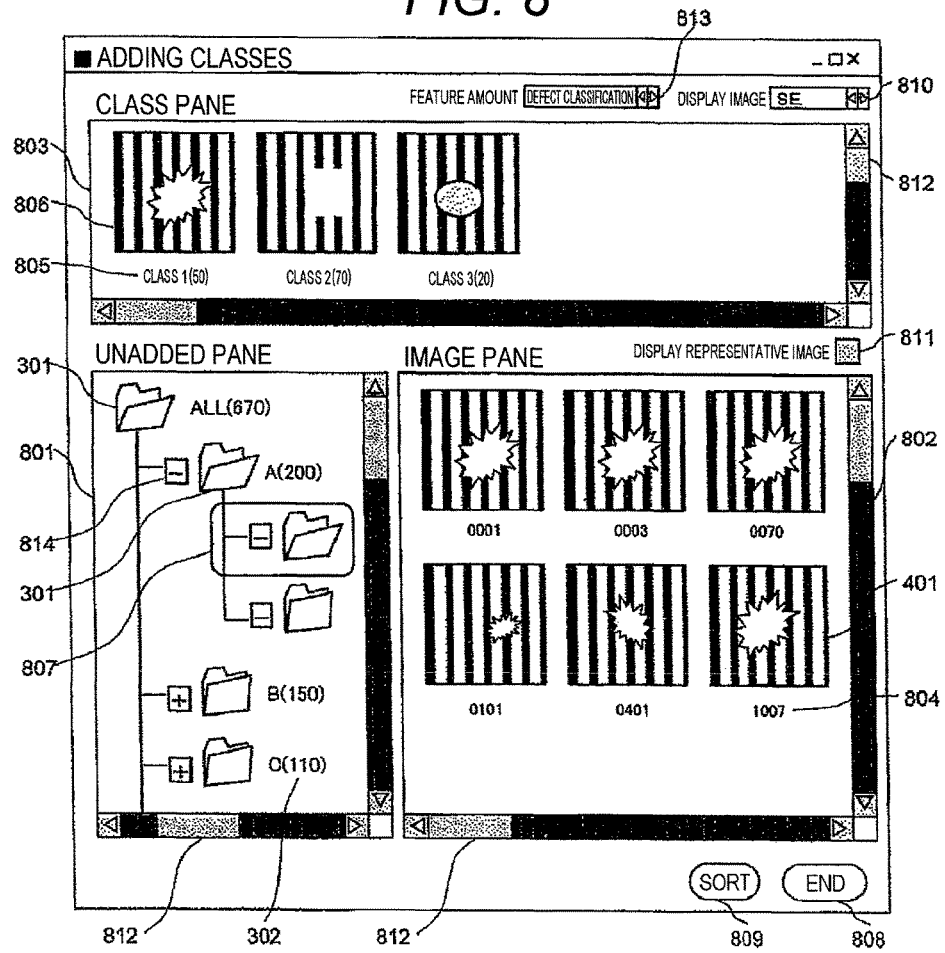
FIG. 8 illustrates an example of a GUI of the classification apparatus according to first embodiment of the present invention.

FIG. 8 illustrates an example of the GUI of the classification apparatus according to first embodiment of the present invention. In the example in FIG. 8, three panes: an unadded pane 801; an image pane 802; and a class pane 803; are displayed in a GUI screen. Each pane will be described below.

The unadded pane 801 displays the hierarchical structure described with FIGS. 3 and 4. The hierarchical structure is a structure in which, as described using FIGS. 3 and 4, as the layer is deeper, the ratio of images of a particular class to one or more images in the folder in a folder 301 is higher. Note that the folder 301 may display an image (for example, a representative image) included in each folder. In addition, the folder 301 may be added to any layer and may be deleted by a user's instruction.

The image pane 802 displays a list of images 401 included in a folder selected by the user in the unadded pane. Information 804, such as the IDs, and feature amounts of the images, may be displayed together with the images. The selection of the folder may be performed by input such as clicking on the folder 301 in the unadded pane by the user with the mouse. 807 denotes a frame for enabling the user to identify the selected folder. The background color of the folder is changed, and the icon of the folder is changed, and the like, without limiting to displaying the frame, whereby it may be possible for the user to identify the selected folder. Here, only one folder is selected, but it may be possible that by selecting multiple folders, images be displayed in the image pane 802 in units of the selected multiple folders. It may be possible that by displaying images in multiple folders at one time to enable the user to compare the images in the multiple folders, folder change be performed such as determining by the user whether to generate further lower folders, and moving by the user an image in a folder A to a folder B. In addition, it may be possible that images divided into those in the folder A and those in folder B be collected into one folder. In addition, by making it possible to display a representative image in each folder, on the basis of this, it may be determined whether to create a new folder and to delete an already existing folder.

The class pane 803 displays class labels 805 each indicating added class information (a class name, a class ID, the number of images with class information added to is), and representative images 806 with items of class information added to them. The representative images are images representing images with items of class information added to them. For example, a representative image of class 1 may be an image of a feature amount closest to the average of feature amounts in images with class information of class 1 added to them. In order to provide the user with means for confirming images with class information added to it, with an operation such as clicking on one representative image 806 in the class pane 803, images with items of class information, the images corresponding to the representative image 806, may be displayed in list form in the image pane 802.

In addition, in a case where the user desires, it may be possible that the images displayed in the class pane 803 be changed to other images of the same class.

808 denotes a button for ending addition of class information.

809 denotes a button for rearranging the images displayed in the image pane 802. By selecting one image displayed in the image pane, images on the image pane 802 may be rearranged in the order of similarity to the selected image. To rearrange the images in the order of similar images, by calculating distances of feature amounts for the selected image and the respective images on the image pane 802, the images may be rearranged in an order in which the distances are closer.

In addition, multiple images may be selected, and in that case, by calculating an average feature amount of the selected images, and distances of feature amounts for the respective images on the image pane 802, the images may be rearranged in an order in which the distances are closer.

In addition, the images may sequentially be displayed from an image closer to an average value of feature amounts of images in the same folder without selecting any image.

In addition, by selecting a class representative image 806 with class information added to it, on the class pane 806, the images in the image pane 802 may be rearranged in the order of similarity to the representative image with class information added to it.

In addition, by selecting a folder 301 in the unadded pane, the images in the selected folder may be rearranged in the order of dissimilarity to images in the folder. For example, the images may sequentially be rearranged from an image furthest to an average value of feature amounts of the images in the folder. This makes it possible to collectively display images (irregular images) of different classes that coexist in the folder in near regions. Accordingly, the user may decide whether to generate a further lower folder.

In the foregoing, with a button 809 for rearranging images, similar images (that is, images of the same class), or irregular images (that is, images of different classes), are collectively displayed such that they are near. Thus, a function of facilitating collective selection of images of the same class or irregular images is provided to the user.

810 denotes a combo box capable of selecting a type of images to be displayed in the image pane 802 and the class pane 803. An SE image, an L image, an R image, or the like, may be selectable. Note that also mixed images, such as an SE image, an L image, and an R image, may be selectable, and the mixed images may be displayed in the image pane 802, the class pane 803, or the like.

811 denotes a check box for displaying representative images in the image pane 802. In a case where the check box is checked, representative images in folders below the folder 807, which is being selected, are displayed in list form in the image pane 802. Ina case where the representative images are displayed, by changing a background color of the images or the like, it may be displayed to the user that the representative images are being displayed. Representative images in a folder may be such as images of a feature amount closest to an average feature amount of the images in the folder. In addition, representative images in a particular layer of the hierarchical structure may be displayed in list form in the image pane 802. For example, in the case of displaying the second layer in the example of FIG. 8, representative images of folder labels A, B, C, or the like, may be displayed. In the case of the third layer, representative images below the folders of folder labels A, B, and C are displayed in list format. Designation of a layer to be displayed may be performed by a combo box (not illustrated), a slide bar (not illustrated), or the like. Here, the depths of layers of images to be displayed at one time may mutually differ, and may be optionally selected by the user or the like.

812 denotes a scroll bar in each pane. Images and hierarchical structures that cannot be displayed within each pane may be displayed by the scroll bar 812 or the like.

813 denotes a combo box for selecting from among combinations (feature amount sets) of feature amounts including one or more feature amounts, the combinations being used to rearrange images with the sort button 809. In the example of FIG. 8, feature amounts are selected for the purpose of defect classification. The feature amount sets are changed in accordance with purposes of classification. In addition, for each feature amount, by preparing a check box (not illustrated) that enables setting which of feature amounts to be used, and causing the user to select, a checked combination of feature amounts may be used as a feature amount set. A technique for the distance calculation in S504 may be selectable. Here, what is selectable is not a combination of feature amounts, and an appropriate combination of feature amounts may be automatically selectable such that the user selects a purpose of classification.

814 denotes a folder display button for switching between display and no display of folders below the folder 301, which is targeted. The folder display button 814 is disposed near each corresponding folder for each folder 301. The button is pressed, whereby folders connecting to below a corresponding folder are displayed in the unadded pane 801. In a case where the folders connecting to below the corresponding folder have already been displayed in the unadded pane 801, the folders connecting to below the corresponding folder are hidden. In a case where folders further lower than a below displayed folder are displayed, also the further lower folders are hidden. Whether or not the lower folders are being displayed may be displayed by changing an icon of the folder display button 814. In the example of FIG. 8, although the folders of labels B and C, whose icons indicate "+" are not displayed, the folders below the folder of label A, whose icon represents display of a list, are displayed. When the folder 301 is selected such as by clicking on the folder 301, the folder display button may operate similarly to a case where the folder display button is pressed. In other words, the folder 301 is selected, whereby folders connecting to below the folder are displayed in the unadded pane 801. In addition, in a case where the folders connecting to below the folder have already been displayed in the unadded pane 801, the folders connecting to below the folder may be hidden.

In an operation of searching for folders including only images of a single class, the user selects any folder and confirms images included in the folder in the image pane 802. In a case where the selected folder is not a folder including only a single class (in a case where images of different classes coexist), the user confirms lower folders and designate folders including a single class. After an initial state displays a root folder and folders (in the example of FIG. 8, the folders of labels A, B, and C) in the second layer, folders below a folder including images whose confirmation is complete are displayed. This makes it possible to provide a means that displays a folder including images which have been confirmed by the user, or folders below the folder.

In addition, in the hierarchical structure displayed in the unadded pane 801, by hiding unnecessary folders, an area required for displaying the hierarchical structure can be minimized.

As described above, by providing a function that enables switching between display and no display of lower folders at optional timing, user's usability can be improved.

Figure 9:
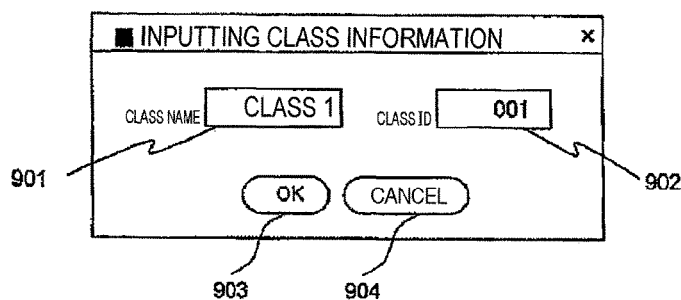
FIG. 9 illustrates an example of a GUI of the classification apparatus according to first embodiment of the present invention.

FIG. 9 illustrates one example of the GUI of the classification apparatus according to first embodiment of the present invention.

901 denotes a text box that receives input of a class name by the user, and 902 denotes a text box that receives input of a class ID by the user. Regarding the class name and class ID of 901 and 902, class information stored in the class information storage unit 111 may be read out and selectable by the user. In addition, class information defined in a text file or the like may be read out and displayed as options.

903 denotes a button that receives class information input with 901 and 902, and 904 denotes a button that cancels input.

Note that, although FIG. 9 illustrates a GUI example in which 901 and 902 are disposed on an independent window, 901 and 902 may be disposed in part of the window in FIG. 8, and an operation of inputting a class name may be performed in the class pane and on the unadded pane screen.

Figure 7:
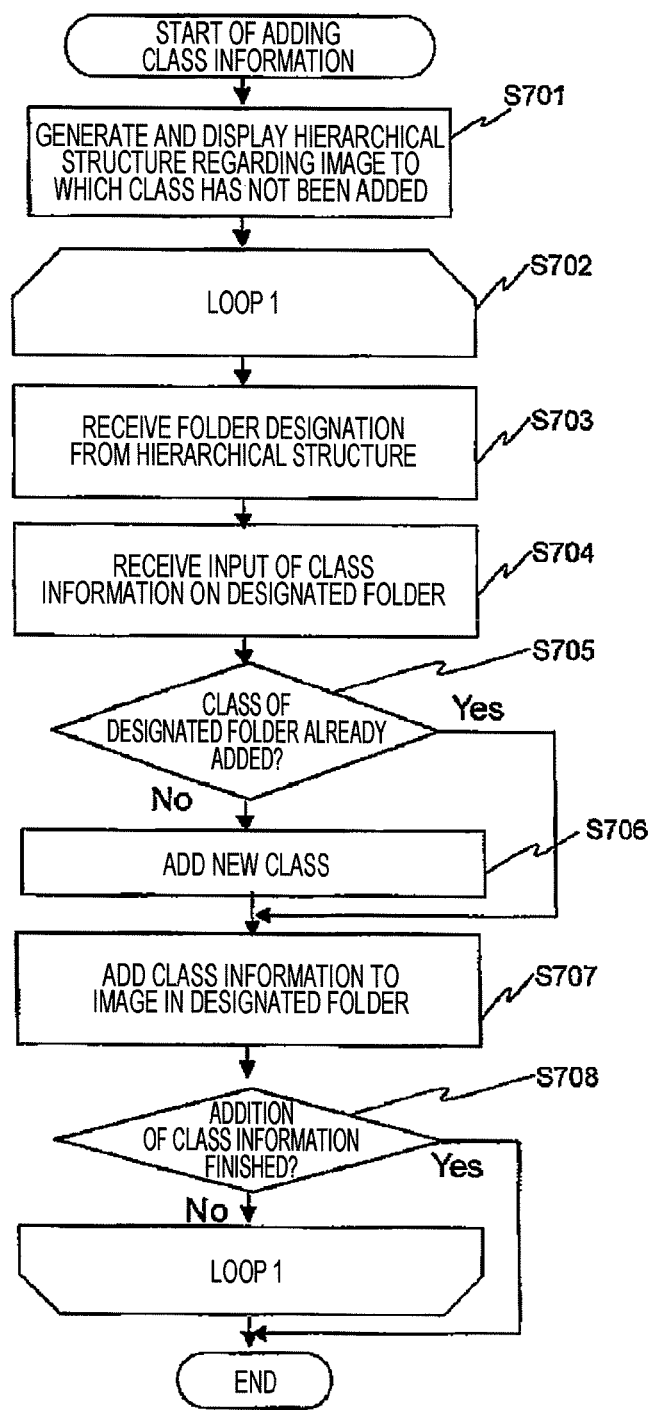
FIG. 7 is a process flowchart of adding class information to each image in the classification method according to first embodiment of the present invention.

FIG. 7 is a processing flowchart that adds class information to each image in the classification method according to first embodiment of the present invention. The following will describe, using FIG. 7, a method, in the classification apparatus according to the present invention, that adds class information to each image stored in the image storage unit 110 and that stores the class information in the class information storage unit 111.

FIG. 7 is illustrated a processing flow that adds class information to each image stored in the image storage unit 110. The process of FIG. 7 is executed on the GUI described using FIGS. 8 and 9.

In S701, by using the technique described in the flows of FIGS. 5 and 6, a hierarchical structure is generated for an image to which class information has not been added, and is displayed on the input/output device 104. The hierarchical structure is displayed in the unadded pane 801 in the GUI of FIG. 8.

S702 is a loop that repeats processing of S703 to S708 until it is determined in S708 that addition of class information has finished.

S703 is processing that receives designation of a folder by the user from among the folders in the hierarchical structure displayed in S701. At this time, the processing causes the user to confirm images included in a folder and to designate folders including only a single class. To cause the user to designate folders including only a single class, as described above, the user is caused to confirm images in a folder, and in a case where the folder is not a folder including only a single class (that is, in a case where images of different classes coexist), the user is caused to confirm lower folders and to designate a folder including only a single class. Designation of a folder by the user may be performed such that the folder 301 in the unadded pane 801 is moved to a class pane. The movement may be executed such that the folder is dragged and dropped. In addition, in a case where the representative images of the folder are displayed in the image pane 802 by the representative image display check box 811, one representative image in the image pane 802 is moved to the class pane, whereby it may be regarded that a folder corresponding to the moved representative image has been moved to the class pane. In this case, the corresponding folder is designated. Here, the description is given on a precondition that a folder including only a single class is designated. However, it may be possible that a folder including images of multiple classes is determined depending on user's determination.

In S704, input of class information to be added to the image in the designated folder is received. The class information is information, such as a class name and a class ID, for identifying a class. At the time the folder for which the input is received in S703 is moved to the class pane, the GUI of FIG. 9 may be displayed and the input of the class information may be received.

In S705, it is determined whether or not the class for which the input is received in S704 has already been added in new class adding processing in S706. If the class has not been added, S706 is executed. If the class has already been added, the processing in S706 is skipped.

In S706, the class whose input has been received in S704 is added as a new class to the class pane 803, and the class information is stored in the class information storage unit 111. To add a new class to the class pane, a representative image and class label of the already added class may additionally be displayed in the class pane 803. This makes it possible to provide a means that confirms the already added class information and the corresponding image. Here, in a case where the class has already been added, it may be possible that the original image and the added image are combined to calculate a representative image again and an image to be displayed if necessary is changed.

In S707, the class information whose input has been received in S704 is added to each image in the designated folder for which the input has been received in S703. The class information added to each image is stored in the class information storage unit 111. For example, class information corresponding to the IDs of images may be stored as a list. Note that the designated folder including the image with the class information added to it in S707, and folders below the designated folder indicate, to the user, that the class information has already been added. For example, the designated folder and the folders below the designated folder may be deleted from the hierarchical structure, and it may be displayed that by coloring the folder, the class information has already been added. Note that in a case where in S703, the folder 301 of the unadded pane 801 has been moved to the class in the class pane 803 for which the class information has already been added (for example, in a case where the folder is dropped to the representative image 806 and the class label 805 such that it is dragged and dropped), the processing of S704 to S706 may be skipped and class information of the destination may be added to the images in the moved folder.

S708 is processing that determines termination of adding class information to the image. If it is determined that the addition of the class information is to be finished, the loop 1 of S702 is escaped to finish the process, while if it is determined that the addition is not to be finished, repetition of the loop 1 of S702 is continued. As examples of the determining method, there can be methods such as a method in which input of the termination by the user is received such that the end button of 808 is pressed, and a method in which the termination is determined in a case where class information has been added to all images.

In S703, by respectively assigning optional keys on the keyboard to classes to which class information has already been added, it may be regarded that an entered key has moved a folder to a corresponding class (that is, input of class adding information has been received). Information on the keyboard subjected to the assignment may be stored as part of class information in the class information storage unit 111. For example, assuming a case where class information on class 1 and class 2 has already been added to images (that is, representative images of class 1 and class 2 are displayed in the class pane 803), it is regarded that F1 of the keyboard has been assigned to class 1 and F2 of the keyboard has been assigned to class 2. The user selects a folder including only images of class 1 and presses F1, whereby S704 to S706 are skipped and the class information on class 1 is added to the images in the selected folder. Also addition of the class information on class 2 is similarly performed such that the F2 button is pressed. Assignment of keys may be defined in a text file or the like, and may be input together when the user inputs class information. In addition, when a new class has been added in S706, keys may automatically be assigned in a sequential manner. The assignment of the keys eliminates the operation of dragging and dropping, thus enabling a reduction in the time required for the processing of S703 to S707.

In addition, it may be regarded that after selecting a folder in the unadded pane, a class ID and a class name have been moved to a class on the class pane, which corresponds to a case where they have been input from the keyboard (that is, input of class adding information has been received). For example, in a case where the ID of class 1 is "001", after a folder including class 1 is selected by the user, the keyboard inputs "001", whereby S704 to S706 are skipped and the class information on class 1 is added to the images in the selected folder. Similarly to the assignment of the keys, the operation of dragging and dropping is eliminated, thus enabling a reduction in the time required for the processing of S703 to S707.

In addition, when the user selects a folder in the unadded pane 801, folders including images having feature amounts close to feature amounts of the images in the selected folder, and classes may be displayed for the user. For example, by comparing the average of feature amounts of images in the folder with the average of feature amounts of images of each class displayed in the class pane 803, a background color of a class having a closest feature amount may be changed or the like.

The foregoing has indicated that the folder 301 has been moved to the class pane 803, whereby the processing of S703 to S707 adds class information to images in a folder. By replacing S703 to S707 with the flow illustrated in FIG. 11, class information may be added to one or more images designated in the image pane 802.

Figure 11:
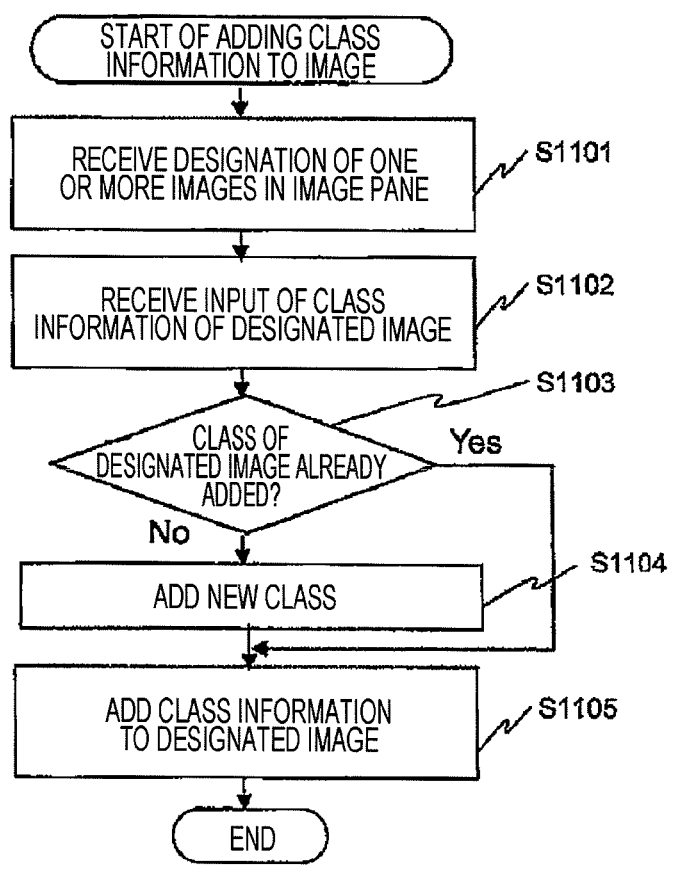
FIG. 11 is a chart of a flow of adding class information to one or more images designated in an image pane in a classification method according to first embodiment of the present invention.

FIG. 11 is a processing flowchart that, in the classification method according to first embodiment of the present invention, adds class information to one or more images designated in the image pane. S1101 to S1105 correspond to S703 to S707, respectively.

S1101 is processing that accepts designation of one or more images by the user from among the images 401 displayed in the image pane 802. The designation of one or more images by the user may be performed such that one image 401 in the image pane 802 is moved to the class pane. The movement may be executed such that the image is dragged and dropped.

S1102 receives input of class information to be added to the one or more images designated. When the one or more images whose input has been received in S1101 are moved, the GUI of FIG. 9 may be displayed and input of class information may be received.

S1103 determines whether or not the class whose input has been received in S1102 has already been added in new class adding processing in S1104. If it has not been added, S1104 is executed. If it has already been added, processing in S1104 is skipped.

In S1104, the class whose input has been received in S1102 is added as a new class to the class pane 803, and the class information is stored in the class information storage unit 111.

In S1105, the class information whose input has been received in S1102 is added to the one or more images whose input has been received in S1101. The class information added to each image is stored in the class information storage unit 111. Note that it is displayed to the user that the one or more images for which the class information has been added in S1105 is in a state with class information already added. For example, the designated one or more images may be deleted from the hierarchical structure, and by changing the background color of the images, it may be displayed in the class pane that the class information has already been added. Note that in a case where in S1101, the one or more images 401 in the image pane 802 have been moved to a class information added class in the class pane 803 (for example, in a case where one or more images are dropped to the representative image 806 or the class label 805 by dragging and dropping), processing in S1102 to S1104 is skipped and class information of the destination may be added to the moved one or more images.

In S703, in a case where images of a small number of different classes coexist in the folder, before the processing in S703, by receiving a correcting instruction such as moving these images to another folder, the targeted folder may be corrected to a folder including only images of a single class. The correction may be performed such that an image in the image pane 802, which is to be moved, is dragged and dropped to a destination folder or the like. The moved image is deleted from the original folder and is added to the destination folder. Plural images are selected and moved, whereby the multiple images may be moved to another folder. At the time of selecting the images to be moved, by using the button 809 that rearranges the images in the image pane 802, the selection is facilitated. For example, in a case where the user performs correction on a folder in which a large number of images of class 1 and a small number of images of class 2 coexist, by selecting one or more images of class 1 and rearranging them in the order of dissimilarity, images (that is, images of class 2) that are dissimilar to class 1 are sequentially arranged by 809. Since the arranged images of class 2 are collectively displayed such that they are close, they may be collectively selected with the mouse.

In S703, when the folder or image is dragged, images in the folder being dragged or the image being dragged may be displayed in another window or pane, or the like. In addition, images in the folder being dragged, information such as an ID in each image, the image being dragged, and the like, may be translucently displayed. The foregoing provides the user with a means that confirm images in a folder being dragged and an image being dragged. In addition, when the folder or image is dragged, by moving a mouse cursor onto the folder 301, images included in the folder 301 may be automatically displayed in the image pane 802, another window, another pane, or the like. In addition, similarly, when the mouse cursor is moved onto one representative image 806 in the class pane 803, the image, to which class information according to the representative image 806, may be automatically displayed in the image pane 802, another window, another pane, or the like. This provides the user with a means for the user to confirm a class added image corresponding to a drop-destination folder or representative image.

In addition, when images in a folder are changed such that the images are moved to a different folder, a hierarchical structure may be regenerated such that a folder selected by the user with the technique of FIGS. 5 and 6. In this case, the hierarchical structure may be generated for only images included in the selected folder. The regeneration of the hierarchical structure may be automatically executed in a case where the images included in the folder have changed.

The GUI having the above-described functions is executable by a program executed by a computer. Also, this program is recorded in a storage medium such as a memory or an external storage medium, and is executed such that it is read out.

A method that, in the classification apparatus 101 illustrated in FIG. 1, implements the classification adding processing procedure described using FIG. 7 will be described below.

Images captured by the image capturing apparatus 102 illustrated in FIG. 1 are stored in the image storage unit 110 in the classification apparatus 101 via the communication means 103. The images stored in the image storage unit 110 are processed by a computer program that executes the hierarchical structure generating procedure described using FIGS. 5 and 6, using the image feature calculating unit 113 and the hierarchical structure generating unit 114, and the hierarchical structure is stored in the hierarchical structure storage unit 112. The overall controller 105 displays the GUI described with FIG. 8 on the display of the input/output unit 114 via the input/output I/F 108. The hierarchical structure stored in the hierarchical structure storage unit 112 is displayed on the GUI displayed on the display of the input/output unit 114 via the input/output I/F 108. The overall controller 105 stores folder designation from the GUI in the receiving memory 109 via the input/output I/F 108. Subsequently, on the display of the input/output unit 114, the class information input GUI illustrated in FIG. 9 is displayed via the input/output I/F 108. The overall controller 105 receives and stores input of class information from the GUI in the memory 109 via the input/output I/F 108. The designated folder and class information stored in the memory 109 are transmitted to the class information adding unit 115, and the class information and information on images in the designated folder are transferred to the class information storage unit ill. The class information stored in the class information storage unit 111 and information on the images in the designated folder are displayed on the GUI via the input/output I/F 108.

The program is input via an external storage medium (not illustrated) connected to the classification apparatus 101 or the input/output device 104, the communication means 103 connected to the classification apparatus 101 or the input/output device 104, or the bus 116, or is stored in a nonvolatile memory (not illustrated) in the memory 116. Next time and thereafter, regarding the program, the program stored in the nonvolatile memory (not illustrated) in the memory 116 is read out and executed.

The foregoing embodiment has stated a GUI, an apparatus, a program, and a storage medium storing the program that make it possible to easily perform a user class adding operation in a short time by receiving input of user's designation of a folder by displaying a hierarchical structure to the user, and collectively adding class information to images in the designated folder.

Second Embodiment

As second embodiment, with an apparatus and a processing flow that are identical to first embodiment, a GUI and an apparatus that facilitate adding class information to images will be described. A difference from first embodiment is that the GUI includes an added pane that displays a hierarchical structure for a class-added class. The GUI will be described below. Although this embodiment gives a description for a case where images captured by an observation apparatus with an SEM are classified similarly to first embodiment, those other than SEM images may be input to an automatic image classifying apparatus according to this embodiment, and also images captured using an optical means, an ion microscope, or like, may be input.

Figure 10:
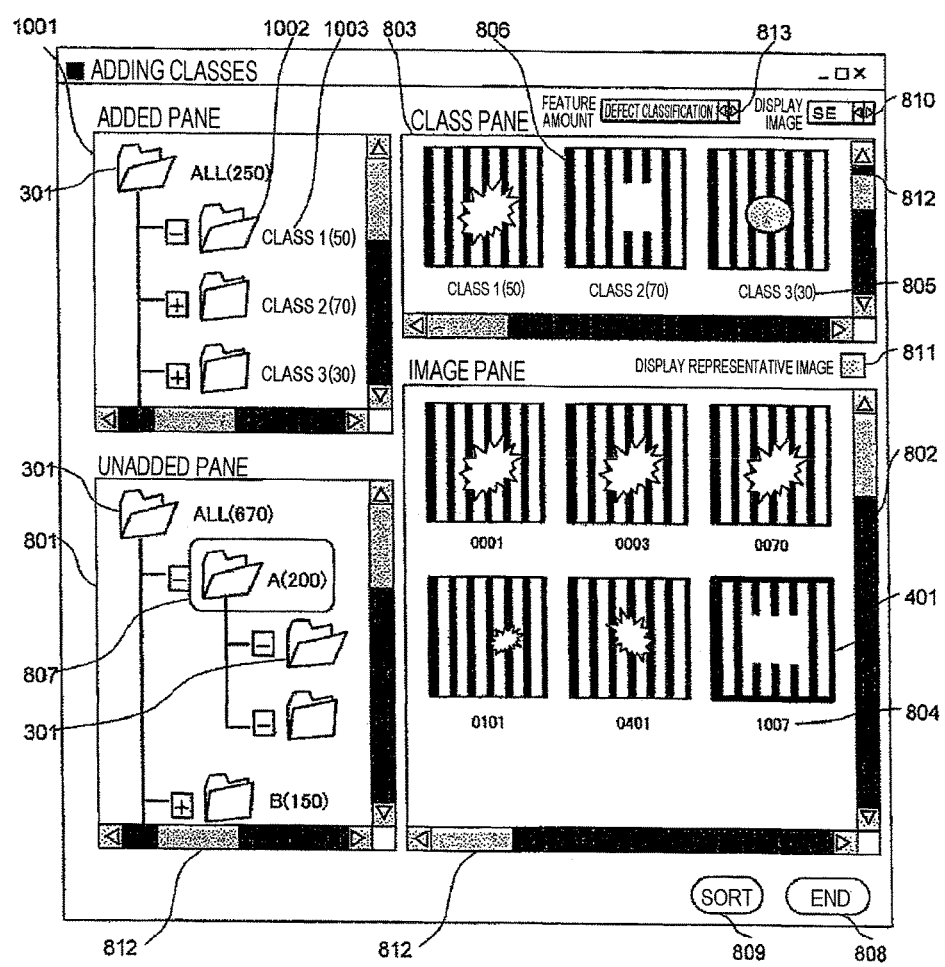
FIG. 10 illustrates an example of a GUI of a classification apparatus according to second embodiment of the present invention.

FIG. 10 illustrates an example of a GUI of the classification apparatus according to second embodiment of the present invention.

1001 denotes an added pane displaying a hierarchical structure for class information added classes.

1002 denotes class folders corresponding to classes, displayed in the class pane 803 to which items of class information have already been added. Each class folder 1002 means a set of images similarly to the folder 301, and is a set of images with corresponding class information added to them. In S706 a new class is added, and when class information to images in a designated folder is added in S707, a class folder is generated correspondingly to the new class, and is displayed on the added pane 1001.

1003 denotes class folder labels displaying items of class information on corresponding class folders 1002 and the numbers of images with items of class information added to them. Regarding the class folder labels, class names can be changed similarly to FIG. 9.

In S703, when the folder 301 on the unadded pane 801 or the image 401 on the image pane 802 has been moved to the added pane 1001 by dragging and dropping, or the like, designation of the moved folder may be received. In a case where a moving destination is one class folder 1002 on the added pane 1001, processing of S704 to S706 may be skipped and class information according to the moving destination may be added to the moved folder.

In addition, when in S707, the class information is added to the images in the designated folder, the designated folder may be connected to below the class folder corresponding to class folder the added class information. In addition, the designated folder may be connected to below the, while maintaining a hierarchical structure below the designated folder.

By such as clicking on the folder 301 on the added pane 1001 or the class folder 1002, the folder or images included in the class folder may be displayed in the image pane 802. This provides the user with a means that confirms the images included in the folder and images with class information added them.

At the time the folder 301 on the added pane 1001 or the images included in the class folder 1002 has changed, by using as a root folder the folder or class folder selected by the user using the technique of FIGS. 5 and 6, the hierarchical structure may be regenerated. In this case, the hierarchical structure may be generated only for the selected folder or the images included in the class folder. The regeneration of the hierarchical structure may be automatically performed in a case where the folder or the images in the class folder has changed. By regenerating the hierarchical structure for the class folder, and displaying it the user, an operation of detecting an image with incorrect class information added to it is facilitated.

The GUI having the above-described function can be realized by a program executed by a computer. In addition, this program is recorded in a storage medium such as a memory or an external storage medium, and is read out, whereby it is executed.

The program is input via an external storage medium (not illustrated) connected to the classification apparatus 101 or the input/output device 104, or is input via the communication means 103 connected to the classification apparatus 101 or the input/output device 104 or the bus 116, and is stored in the memory 116 or a nonvolatile memory (not illustrated) in the memory 116. Next time and thereafter, the program stored in the nonvolatile memory (not illustrated) in the memory 116 is read out and executed.

Although the foregoing has specifically described the present invention made by the present inventors on the basis of the embodiments, needless to say, the present invention is not limited to the embodiments, and the present invention is variously modified without departing from the gist of the present invention. Although the embodiments described herein have described a GUI and an apparatus that enable facilitating addition of class information to images captured by a review SEM, the present invention is applicable to images obtained from other defect observation apparatuses and checking apparatuses in which class information needs to be added to images.

REFERENCE SIGNS LIST

301 folder
401 image
801 unadded pane
802 image pane
803 class pane
804 image information
805 class label
806 representative image in class
807 frame of a selected folder
808 end button
809 rearrangement button
810 display image type designating combo box
811 representative image display check box
812 scroll box
813 feature amount setting designating combo box
814 folder display button

The invention claimed is:

1. A classification apparatus including a Graphical User Interface (GUI), comprising:
an image capturing apparatus that emits an electron beam to a surface of an object to be checked, detects electrons generated from the surface of the object, and converts the detected electrons into an image; and
a processor including an image feature calculator that calculates a feature amount of the image by processing the image in the image capturing apparatus, a hierarchical structure generator that generates a hierarchical structure of folders including the image using the feature amount of the image calculated by the image feature calculator, and a class information adder that, in a case in which defect class information is externally input for the folders having the hierarchical structure generated by the hierarchical structure generator, adds the defect class information to images in the folders,
wherein the processor is configured to output the GUI comprising
an unadded pane region that displays the hierarchical structure of folders, said folders being associated with sets of images having no defect class information added thereto;
an image pane region that displays images from the sets of images associated with said folders displayed in the unadded pane region, the images displayed in the image pane having no defect class information added thereto; and
a class pane region that displays the images having defect class information added thereto,
wherein by externally inputting defect class information for one image having no defect class information added thereto, the input defect class information is displayed,
wherein said image feature calculator is further configured to calculate a distance between folders based on said calculated feature amounts of a plurality of combinations of two uppermost folders in the hierarchical structure of folders, for all combinations of any two of said uppermost folders, wherein said hierarchical structure generator is further configured to create a new folder in a new uppermost layer associated with folders in which said calculated distance is shorter than a threshold value, wherein said image feature calculator is further configured to calculate a first evaluation value based on a distribution of said calculated feature amounts before said new folder in the new uppermost layer is created, and a second evaluation value based on a distribution of said calculated feature amounts after said new folder in the new uppermost layer is created, and wherein said hierarchical structure generator is further configured to create a further new folder in a further new uppermost layer when said second evaluation value is greater than said first evaluation value by a predetermined threshold amount, and to not create a further new folder in a further new uppermost layer when said second evaluation value does not exceed said first evaluation value by the predetermined threshold amount.

2. The classification apparatus according to claim 1, wherein the processor is further configured to output, via the GUI, an added pane region that hierarchically displays the folders which are sets of images having defect class information added thereto.

3. The classification apparatus according to claim 1, wherein the processor is further configured to receive, via the GUI, a selection of a folder corresponding to the images displayed in the class pane region, and is further configured to output, via the GUI, images included in the selected folder for display in the image pane region.

4. The classification apparatus according to claim 1, wherein when a folder displayed in the unadded pane region is to be moved to the class pane region, the processor is further configured to output, via the GUI, an input screen configured which accepts externally inputted defect class information associated with the folder to be moved, wherein in a case in which the defect class information on a folder to be moved is not displayed in the class pane region, the processor is further configured to output, via the GUI, the defect class information on the folder to be moved, wherein in a case in which a folder in the unadded pane region is to be moved to the class pane region, the processor is further configured to receive, via the GUI, defect class information corresponding to the folder to be moved, and wherein for images corresponding to the folders displayed in the unadded pane region, the processor is further configured to output, via the GUI, folders having a hierarchical structure and sorted into folders having a hierarchical structure on the basis of types of feature amounts externally input.

5. The classification apparatus according to claim 1, wherein the defect class information includes at least one of a class ID and an assigned input means, and wherein the processor is further configured to output, via the GUI, the defect class information including at least one of the class ID and the assigned input means.

6. The classification apparatus according to claim 1, wherein the processor is further configured to provide a sorting function of rearranging the images displayed in the image pane region on the basis of feature amounts of the images.

7. The classification apparatus according to claim 1, wherein the processor is further configured to receive, via the GUI, a selection of a predetermined layer for display in the unadded pane region, and is further configured to output, via the GUI, a representative image of folders existing in the selected folder.

8. A classification method comprising:
an image capturing step comprising emitting an electron beam to a surface of an object to be checked, detecting electrons generated from the surface of the object, and converting the detected electrons into an image; and
a processing step including an image feature calculating step of calculating a feature amount of the image by processing the image obtained in the conversion in the image capturing step, a hierarchical structure generating step of generating a hierarchical structure of folders including the image by using a feature amount of the image calculated in the image feature calculating step; and a class information adding step of, in a case in which defect class information is externally input for the folders having the hierarchical structure, adding the defect class information to images in the folders; and
a display step of displaying via a Graphical User Interface (GUI)
an unadded pane region that displays the hierarchical structure of folders, said folders being associated with sets of images having no defect class information added thereto;
an image pane region that displays images from the sets of images associated with said folders displayed in the unadded pane region, the images displayed in the image pane having no defect class information added thereto; and
a class pane region that displays the images having defect class information added thereto,
wherein by externally inputting defect class information for one image having no defect class information added thereto, the input defect class information is displayed, wherein said image feature calculating step further comprises calculating a distance between folders based on said calculated feature amounts of a plurality of combinations of two uppermost folders in the hierarchical structure of folders, for all combinations of any two of said uppermost folders, wherein said hierarchical structure generating step further comprises creating a new folder in a new uppermost layer associated with folders in which said calculated distance is shorter than a threshold value, wherein said image feature calculator is further configured to calculate a first evaluation value based on a distribution of said calculated feature amounts before said new folder in the new uppermost layer is created, and a second evaluation value based on a distribution of said calculated feature amounts after said new folder in the new uppermost layer is created, and wherein said hierarchical structure generator is further configured to create a further new folder in a further new uppermost layer when said second evaluation value is greater than said first evaluation value by a predetermined threshold amount, and to not create a further new folder in a further new uppermost layer when said second evaluation value does not exceed said first evaluation value by the predetermined threshold amount.

9. The method according to claim 8, further comprising outputting, via the GUI, an added pane region that hierarchically displays the folders which are sets of images having defect class information added thereto.

10. The method according to claim 8, further comprising receiving, via the GUI, a selection of a folder corresponding to the images displayed in the class pane region, and outputting, via the GUI, images included in the selected folder for display in the image pane region.

11. The method according to claim 8, wherein when a folder displayed in the unadded pane region is to be moved to the class pane region, further comprising outputting, via the GUI, an input screen configured which accepts externally inputted defect class information associated with the folder to be moved, wherein in a case in which the defect class information on a folder to be moved is not displayed in the class pane region, further comprising outputting, via the GUI, the defect class information on the folder to be moved, wherein in a case in which a folder in the unadded pane region is to be moved to the class pane region, further comprising receiving, via the GUI, defect class information corresponding to the folder to be moved, and wherein for images corresponding to the folders displayed in the unadded pane region, further comprising outputting, via the GUI, folders having a hierarchical structure and sorted into folders having a hierarchical structure on the basis of types of feature amounts externally input.

12. The method according to claim 8, wherein the defect class information includes at least one of a class ID and an assigned input means, and further comprising outputting, via the GUI, the defect class information including at least one of the class ID and the assigned input means.

13. The method according to claim 8, further comprising a sorting function of rearranging the images displayed in the image pane region on the basis of feature amounts of the images.

14. The method according to claim 8, further comprising receiving, via the GUI, a selection of a predetermined layer for display in the unadded pane region, and outputting, via the GUI, a representative image of folders existing in the selected folder.

15. A non-transitory computer-readable storage medium upon which is embodied a sequence of programmed instructions which, when executed by a processor, cause the processor to perform steps comprising:
emitting an electron beam to a surface of an object to be checked;
detecting electrons generated from the surface of the object;
converting the detected electrons into an image;
calculating a feature amount of the image by processing the image obtained in the step of converting;
generating a hierarchical structure of folders including the image by using a feature amount of the image calculated in the image feature calculating step;
receiving defect class information externally input for the folders having the hierarchical structure;
adding the defect class information to images in the folders; and
a display step of displaying in a Graphical User Interface (GUI) an image of the GUI, comprising
an unadded pane region that displays the hierarchical structure of folders, said folders being associated with sets of images having no defect class information added thereto;
an image pane region that displays images from the sets of images associated with said folders displayed in the unadded pane region, the images displayed in the image pane having no defect class information added thereto; and
a class pane region that displays the images having defect class information added thereto,
wherein by externally inputting defect class information for one image having no defect class information added thereto, the input defect class information is displayed,
wherein said calculating the image feature amount further comprises calculating a distance between folders based on said calculated feature amounts of a plurality of combinations of two uppermost folders in the hierarchical structure of folders, for all combinations of any two of said uppermost folders,
wherein said generating the hierarchical structure generating step further comprises creating a new folder in a new uppermost layer associated with folders in which said calculated distance is shorter than a threshold value
wherein said image feature calculator is further configured to calculate a first evaluation value based on a distribution of said calculated feature amounts before said new folder in the new uppermost layer is created, and a second evaluation value based on a distribution of said calculated feature amounts after said new folder in the new uppermost layer is created, and
wherein said hierarchical structure generator is further configured to create a further new folder in a further new uppermost layer when said second evaluation value is greater than said first evaluation value by a predetermined threshold amount, and to not create a further new folder in a further new uppermost layer when said second evaluation value does not exceed said first evaluation value by the predetermined threshold amount.

16. The non-transitory computer-readable storage medium according to claim 15, further comprising outputting, via the GUI, an added pane region that hierarchically displays the folders which are sets of images having defect class information added thereto.

17. The non-transitory computer-readable storage medium according to claim 15, further comprising receiving, via the GUI, a selection of a folder corresponding to the images displayed in the class pane region, and outputting, via the GUI, images included in the selected folder for display in the image pane region.

18. The non-transitory computer-readable storage medium according to claim 15, wherein when a folder displayed in the unadded pane region is to be moved to the class pane region, further comprising outputting, via the GUI, an input screen configured which accepts externally inputted defect class information associated with the folder to be moved, wherein in a case in which the defect class information on a folder to be moved is not displayed in the class pane region, further comprising outputting, via the GUI, the defect class information on the folder to be moved, wherein in a case in which a folder in the unadded pane region is to be moved to the class pane region, further comprising receiving, via the GUI, defect class information corresponding to the folder to be moved, and wherein for images corresponding to the folders displayed in the unadded pane region, further comprising outputting, via the GUI, folders having the hierarchical structure and sorted according to the hierarchical structure on the basis of types of feature amounts externally input.

19. The non-transitory computer-readable storage medium according to claim 15, wherein the defect class information includes at least one of a class ID and an assigned input means, and further comprising outputting, via the GUI, the defect class information including at least one of the class ID and the assigned input means.

20. The non-transitory computer-readable storage medium according to claim 15, further comprising a sorting function of rearranging the images displayed in the image pane region on the basis of feature amounts of the images.

21. The non-transitory computer-readable storage medium according to claim 15, further comprising receiving, via the GUI, a selection of a predetermined layer for display in the unadded pane region, and outputting, via the GUI, a representative image of folders existing in the selected folder.

* * * * *